US006886815B2

United States Patent
Parayre et al.

(10) Patent No.: US 6,886,815 B2
(45) Date of Patent: May 3, 2005

(54) POROUS WALL FOR FORMING A LEVITATION GAS FILM

(75) Inventors: Claude Parayre, Lunel (FR); Nelly Kernevez, Corenc (FR); Gérard Gibon, Sassenage (FR)

(73) Assignee: Commissariat a l'Energie Atomique (FR)

( * ) Notice: Subject to any disclaimer, the term of this patent is extended or adjusted under 35 U.S.C. 154(b) by 9 days.

(21) Appl. No.: 10/239,102

(22) PCT Filed: Apr. 10, 2001

(86) PCT No.: PCT/FR01/01093

§ 371 (c)(1),
(2), (4) Date: Sep. 18, 2002

(87) PCT Pub. No.: WO01/77036

PCT Pub. Date: Oct. 18, 2001

(65) Prior Publication Data

US 2003/0038386 A1 Feb. 27, 2003

(30) Foreign Application Priority Data

Apr. 11, 2000 (FR) .............................. 00 04614

(51) Int. Cl.⁷ ............................... C03B 40/04
(52) U.S. Cl. ................ 261/96; 261/105; 65/25.1; 65/182.2
(58) Field of Search .............. 261/96, 102, 105, 261/122.1; 65/25.1, 182.2

(56) References Cited

U.S. PATENT DOCUMENTS

| 3,961,927 A | | 6/1976 | Alderson et al. ............ 65/25.1 |
| 4,400,191 A | * | 8/1983 | Youngberg et al. .......... 65/21.4 |
| 4,546,811 A | | 10/1985 | Potard |
| 4,632,574 A | * | 12/1986 | Wilson et al. ................ 384/12 |
| 4,866,857 A | * | 9/1989 | Clasen ........................ 34/362 |
| 5,078,775 A | * | 1/1992 | Maltby et al. ............. 65/182.2 |
| 5,293,699 A | * | 3/1994 | Faust et al. ................... 34/642 |
| 5,618,325 A | | 4/1997 | Baniel |
| 6,475,395 B1 | * | 11/2002 | Schmit et al. .............. 210/741 |
| 2002/0062660 A1 | * | 5/2002 | Yoshikuni et al. ........... 65/25.1 |
| 2002/0092326 A1 | * | 7/2002 | Langsdorf et al. ......... 65/182.2 |
| 2002/0194870 A1 | * | 12/2002 | Greulich-Hickmann et al. ........................... 65/25.1 |

FOREIGN PATENT DOCUMENTS

| EP | 0070760 | 10/1985 |
| EP | 0633229 | 4/1997 |
| EP | 0780344 | 6/1997 |
| FR | 2220481 | 3/1974 |
| FR | 2770231 | 10/1997 |
| JP | 63236718 | 3/1988 |
| JP | 11116252 | 4/1999 |
| JP | 11171565 | 6/1999 |

OTHER PUBLICATIONS

Journal of Non–Crystallie Solids, 161 (1993) Aug., No. 1, Amsterdam, NL, Section 1. Raw Materials; purification; analysis; glass, preform and fibre fabrication—Gas film levitation: a unique containerless technique for the preparation of fluoride glass rods—Pascal Baniel and Christian Belouet, pp. 1–6.

* cited by examiner

Primary Examiner—Scott Bushey
(74) Attorney, Agent, or Firm—Hayes Soloway P.C.

(57) ABSTRACT

A porous wall through which a flow of gas is established forming a layer supporting a liquid mass is strengthened partly to stiffen it and partly to control the shape of the lower surface of the supported liquid. Chambers containing different pressures can be formed, and possibly, separated by some of these strengthening parts to improve the equalisation by reducing the pressure at the center. Finally, capillaries may pass through the plate to measure the pressure or provide additional equalisation of the thickness of the layer by a suction device.

8 Claims, 6 Drawing Sheets

POROUS WALL FOR FORMING A LEVITATION GAS FILM

The invention concerns a porous wall for forming a gaseous supporting layer.

The process of support by a gaseous layer forming a cushion is intended to hold a quantity of liquid above a plate or in a receptacle while avoiding direct physical contact that could tarnish or corrode the supporting surfaces or even contaminate the liquid through a chemical reaction. The gaseous layer is formed by blowing the gas into a chamber located behind the porous wall so that it passes through the pores of the wall while maintaining sufficient dynamic pressure.

On the one hand we are trying to increase the quantity of liquid supported while avoiding excessive instability or irregularity in the support. In the present typical case where the wall is in the form of a plate or dish on which the liquid is placed, the problems encountered can be explained in the following manner. Increasing the volume of the liquid implies both an increase in its depth and in its surface area and therefore that of the wall. In the latter case, flexing of the wall produced by the loss of gas pressure through it increases rapidly, so that a limit is set by the strength of the wall whose thickness cannot be increased by much since it would then be difficult to form a gaseous layer of sufficient pressure; if the volume of the liquid is to be increased, the gaseous layer must have a greater dynamic pressure in order to continue to support the liquid, which requires an increase in the pressure of the gas behind the wall and a loss of pressure through the wall and therefore a further increase in the bending force to which the wall is subjected.

On the other hand, we also wish to control the shape of the lower surface of the supported liquid by locally varying the pressure and thus the thickness of the gaseous layer. This is possible by locally increasing the flow of gas through the wall, in particular by making it more permeable. In practice, variations in the pressure and flow of the gas must be considered, in particular the fact that the gas passing through the wall at the centre of the liquid mass has more difficulty in dispersing and creates a higher pressure locally than that at the perimeter of the liquid mass. This phenomenon is accentuated with an increase in the gas flow rate and can lead to the formation of a pocket of gas below the centre of the liquid mass, deforming it more and more and even bursting or dispersing it.

The purpose of the invention is therefore to improve control of the support in order, on the one hand, to increase the volume of liquid supported without fear of breaking the porous diffusion wall and, on the other hand, to control the shape of the lower surface of the liquid mass.

Several embodiments will be proposed which will constitute the same number of possible solutions, but all have the common feature that the wall forms a strengthening structure. A strengthening structure consists of thickened areas that, on the one hand increase its mechanical strength and, on the other hand, permit the flow of gas to be controlled. The implementations of the invention are clearly distinguishable from the usual solutions where the porous wall has a constant thickness, whether it is flat, concave, cylindrical or some other shape. They must also be distinguished from certain earlier designs in which the upper surface, on which the layer of gas is formed, is concave in order to retain the liquid mass better while the lower surface of the wall is flat since the peripheral thickening is not produced by design and is not deliberately placed where the wall is most heavily loaded. In the invention, the strengthening can be distributed over the whole surface of the wall.

The reinforcing structure will be situated on the side of the wall opposite to the gaseous layer. It will consist of ribs having various shapes and directions.

Some of these ribs may be circular which will relieve the centre forming gas chambers with different pressures: if the pressure is lower in the central chamber, the loads will be less and the flow passing through will also be lower.

Such procedures will call for adjustment of the various pressures in improved implementations. It is therefore recommended that capillaries pass through the wall so that the pressure can be measured at different points in the gaseous layer. It would then be possible to control the pressures in the chamber, or each chamber, below the wall. The capillaries could also lend themselves to an active role if they were connected to a device for varying the pressure instead of a pressure measuring device: if, for example, too high a pressure was detected in the gaseous layer at the centre of the wall and the liquid mass, it would be possible to draw off the excess gas at this point by means of the capillary.

A different type of device to counter variations in the pressure of the layer would involve the provision of radial grooves from the edge of the wall on which the gaseous layer is formed so as to facilitate the transfer of gas from the centre of the gaseous layer towards the edge.

The invention will now be described with reference to diagrams, which include:

All the descriptions refer mainly to the diffusing walls whose upper surface forms a plane. They can also be easily applied to walls with upper surfaces of different shapes: cylindrical, spherical and any concave or convex shape, symmetrical or unsymmetrical.

Figure 1:
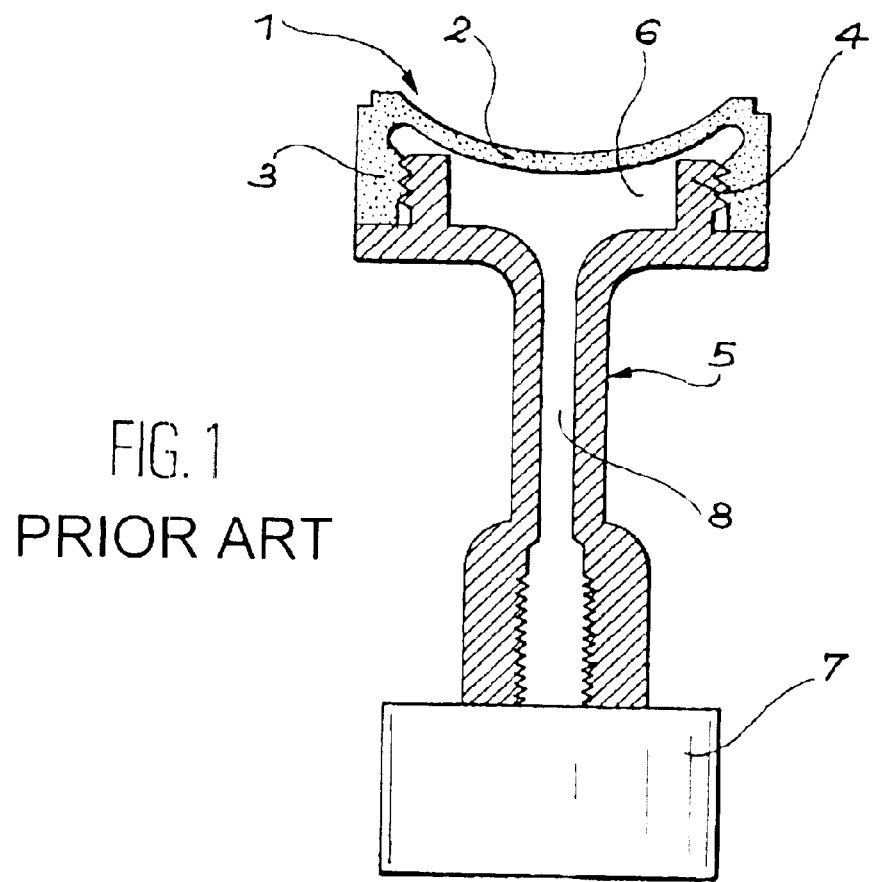
FIG. 1 is a diagrammatic representation of a supporting device of the earlier type.
Figure 2:
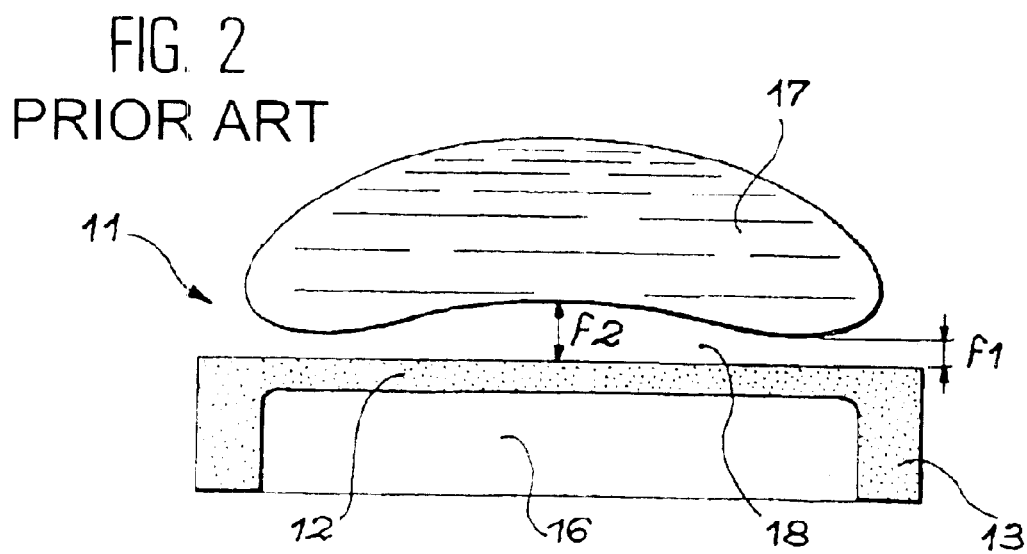
FIG. 2 shows the shape of a liquid mass suspended above a supporting wall of the earlier design.

Referring to FIG. 1, it can be seen that a porous wall 1, of the earlier design, comprises a supporting plate 2 of constant thickness with the hollow side upwards and a flange 3 projecting downwards. A bush 4 on a supporting tube 5 is screwed or crimped into the flange 3 so as to form a gas chamber 6 below the plate 2. A source of gas 7 injects gas under pressure into the chamber 6 through a bore 8 passing through the supporting tube 5, which forms a gaseous layer with positive pressure on the plate 2. This layer is able to support a liquid mass that is formed by capillary forces into a drop that is more or less spread out and deformed. Variations in implementation of the porous wall 1 are clearly possible and a wall that is porous around the edge may surround the porous wall 1 to retain the liquid. We will however refer to FIG. 2 for further explanations. This shows a plate 12 (shown flat for simplicity) of a porous wall 11 again including a lower peripheral flange 13 and a gas chamber 16 below the plate 12, the liquid mass is marked 17 and the intermediate layer of gas 18. If, as with earlier designs, the thickness of the plate 12 is constant over its whole area and the porous material is homogeneous, the gas passes through the plate 12 at a uniform rate which produces a higher pressure at the centre of the liquid mass and therefore an undesirable inflation of the gaseous layer 18 at the centre, where the thickness f2 is significantly greater than the thickness f1 of the layer 18 at the edge.

Figure 3:
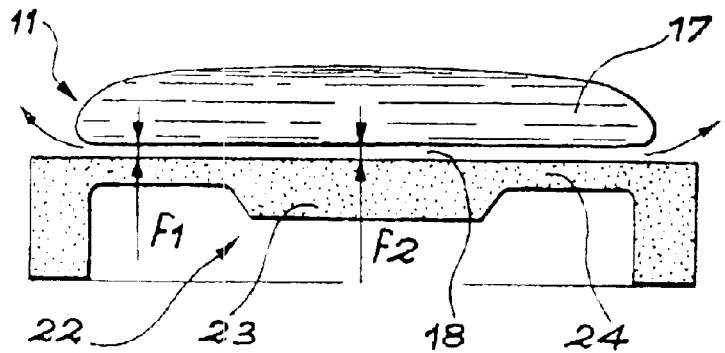
FIG. 3 shows another implementation of the porous plate.
Figure 4:
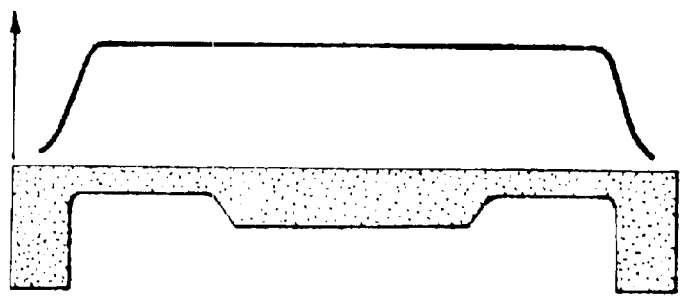
FIG. 4 shows a pressure diagram.

One could create a thickening at the centre of the plate 22 in FIG. 3; the central thickened area is marked 23 and an annulus 24 of the thickness of the plate 12 remains around it. The reinforcement produces both a spreading of the central area 23 where the bending stresses would be greater if the plate were of uniform thickness and a local reduction in the gas flow evens out the pressure below the drop as the diagram in FIG. 4 shows, reducing the difference between the maximum and minimum thickness f2 and f1 of the gaseous layer 18 and the bulging of the liquid mass 17.

Figure 5:
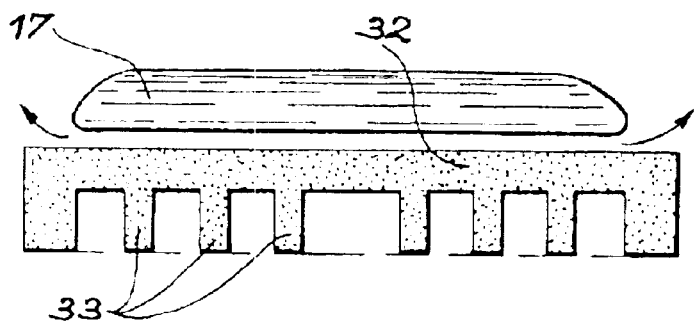
FIG. 5 shows a first implementation of the invention.

Rather than by means of a strengthened central area, we choose to stiffen the plate by forming ribs on it, so that once again its upper surface, on which the gaseous layer is formed remains smooth. A first implementation of the invention is drawn in FIG. 5, in which the plate is marked 32 and the ribs are marked 33. The ribs 33 locally impede the flow of gas which lowers the flow rate at the output of the plate 32 at their location. If the grooves are more numerous or wider towards the centre of the plate 32, the average flow will be slower there than otherwise and a resultant effect opposing the bulging of the liquid mass 17 will be produced.

Figure 6:
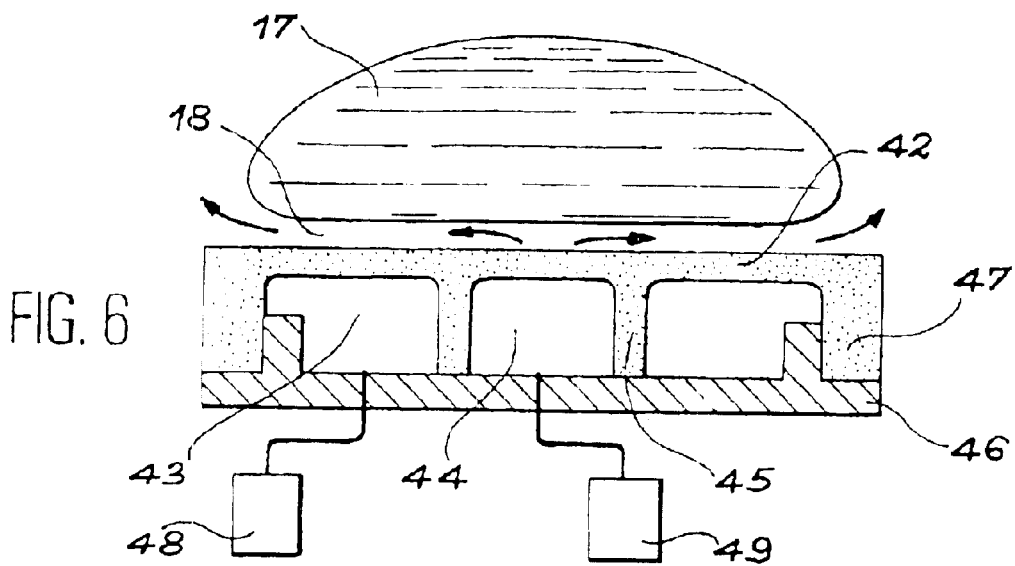
FIG. 6 shows a second implementation of the invention.
Figure 7:
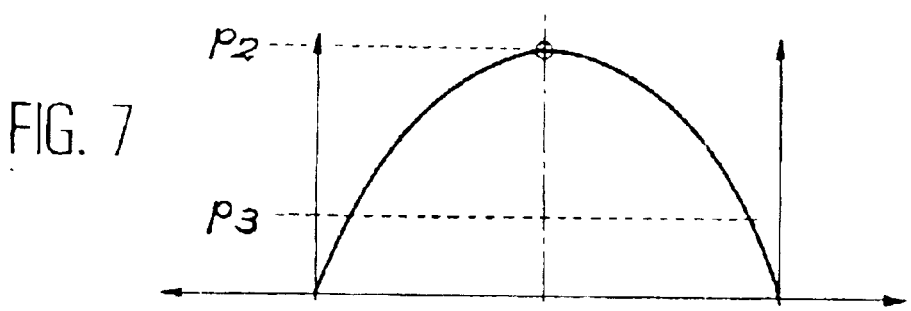
FIG. 7 shows a pressure diagram.

Another advantage is produced by the ribs in the implementation shown in FIG. 6. Continuous ribs, in particular circular ones 45, can form concentric chambers of gas 43 and 44 below the plate 42. A base 46 completes the separation of the chambers by making contact with the lower edge of the rib 45 and extending to the flange 47 of the plate 42. Two gas supply devices 48 and 49 inject gas into the chambers 43 and 44 respectively, at any desired pressure. If these pressures were equal to a common pressure p1, we would essentially revert to the situation in FIG. 2, where a pressure p2 exists at the centre of the gaseous layer 18 and a pressure p3 at the edge; FIG. 7 shows schematically the pressure diagram that would be measured which causes the central bulging of the liquid mass 17 in FIG. 2. If the common pressure p1 is increased, the difference in pressure between p2 and p3 will also increase, as well as the bulging of the liquid mass 17, which would ultimately destroy its cohesion. Instead it is a feature of the invention that the pressure supplied to the central chamber 44 is lower than in the peripheral chamber 43, which equalises the thickness of the gaseous layer 18 and has the further benefit of a flattening of the liquid mass 17 at its centre.

Figure 8:
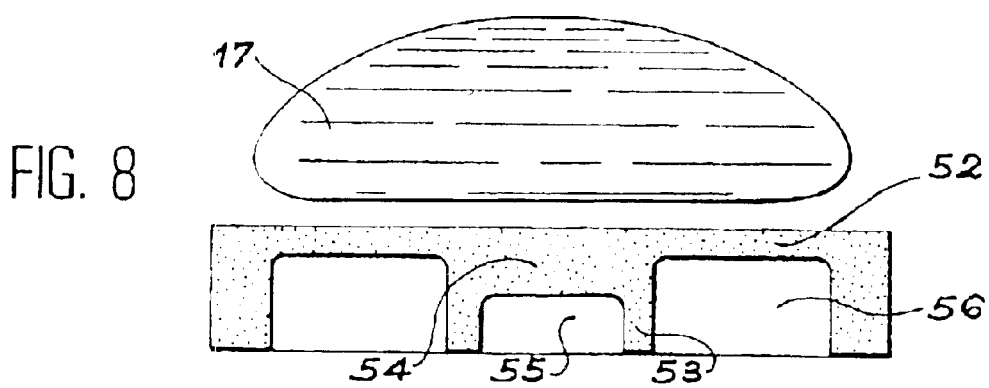
FIG. 8 shows another implementation of the invention.

Generally speaking, it is possible to combine the arrangements proposed in the foregoing or future implementations or certain of their features only. FIG. 8 shows such a composite implementation in which the plate 52 has both a circular rib 53 and a central, thickened area 54 enclosed by the rib 53. The rib 53 may or may not serve to separate two concentric chambers 55 and 56 which are at different pressures, as shown in FIG. 6; however, the thickened part 54 itself exercises a measure of equalisation of the gaseous layer 18.

Figure 9:
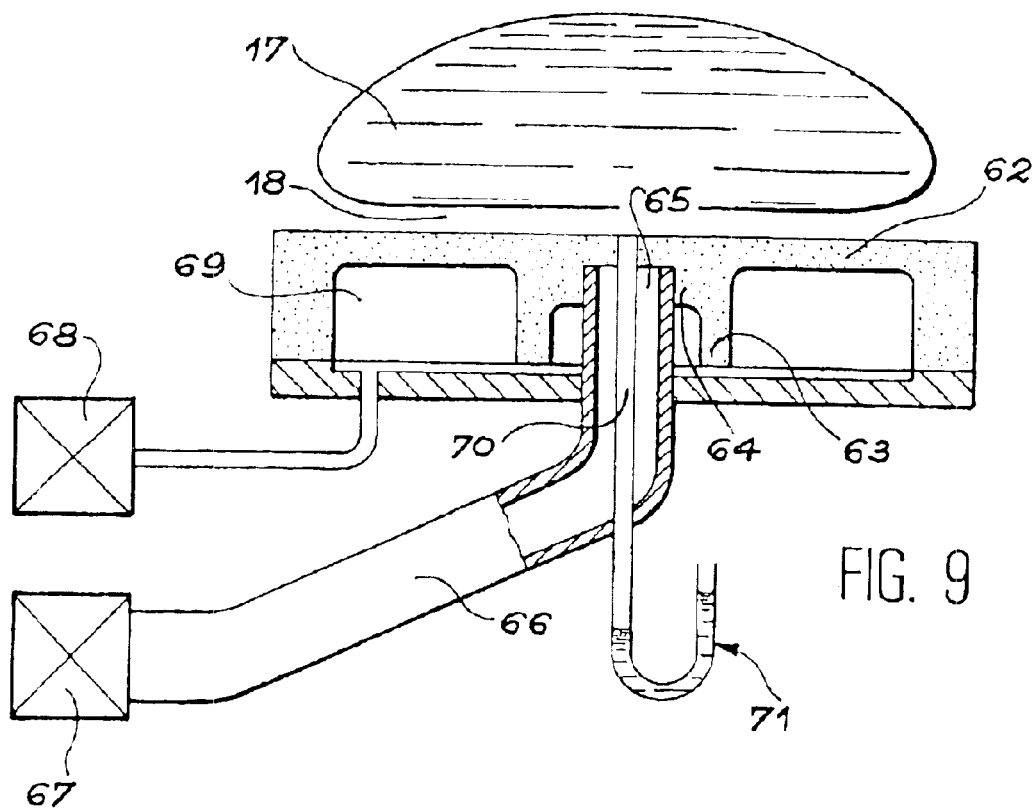
FIG. 9 shows an additional implementation of the invention.

The implementation in FIG. 9 again includes, below a plate 62, a circular rib 63, and a thickened central area 64; a blind hole 65 is bored at the centre of the thickened part 64 and a tube 66 is inserted into it which is connected to a special gas supply 67, different from the gas supply 68 for the chamber 69 surrounding the tube 66 below the plate 62. Finally a capillary 70, surrounded by the tube 66, passes through the plate 62 and terminates at the centre of the gaseous layer 18; it is connected to a pressure measuring device 71. In this complex implementation, the pressure existing in the chamber 69 produces a relatively high gas flow to the edge of the gaseous layer 18 and a lower flow between the tube 66 and the rib 63 owing to the thickened part 64. The original gas from the supply 67 for the tube 66 has only a small thickness to traverse in order to pass through the plate 62, but as its pressure may be reduced, its flow is also low. The capillary 70 provides information on the dynamic pressure acting at the centre of the gaseous layer 18 and permits the pressure or the flow of the original source of supply 67 to be regulated at an acceptable value. The thickness of the gaseous layer 18 can also be equalised.

Figure 10:
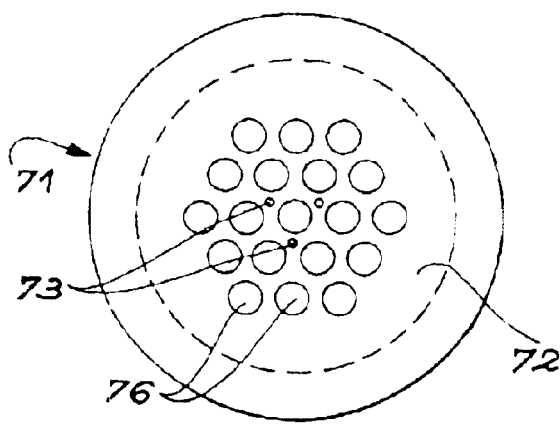
FIG. 10 shows an additional implementation of the invention.
Figure 11:
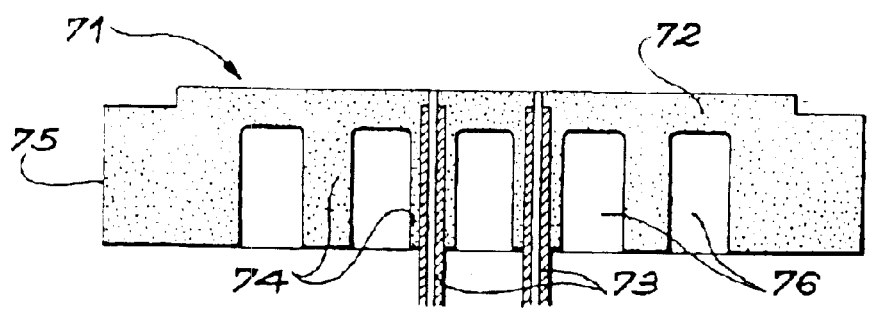
FIGS. 11, 12 and 13 show another implementation of the invention.
Figure 12:
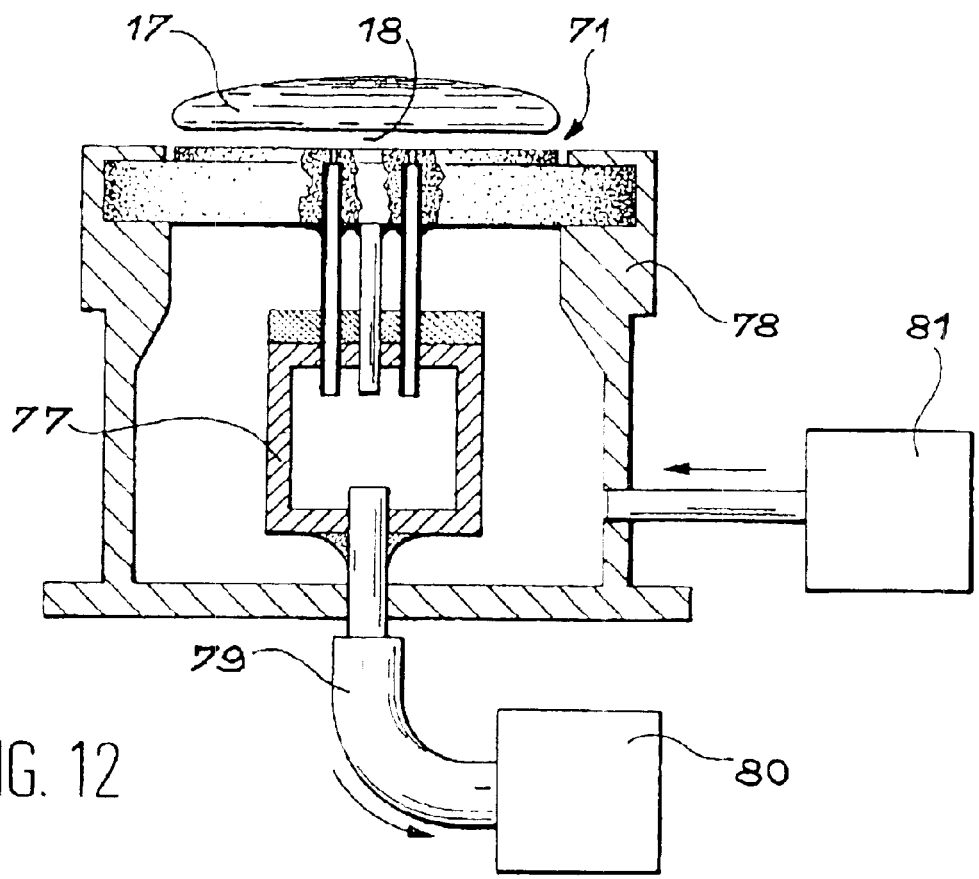

This idea of controlling the pressure distribution in the gaseous layer 18 by the use of measurement capillaries can be generally adopted. FIGS. 10, 11 and 12 show a trio of capillaries 73 arranged around the centre of a plate 72; in this case the ribs 74 are not of a simple shape but are the remaining portions of the porous wall 71 comprising the plate 72 and the surrounding flange 75, after forming a basic porous plate by boring blind holes 76 to reduce the thickness. The capillaries 73 terminate at a manifold 77 enclosed in a mounting 78 for the porous wall 71 and a tube 79 terminating in the manifold 77. This tube can terminate either in a pressure measuring device or a pressure regulating device 80 that sucks in a little gas from the centre of the gaseous layer 18, again in order to reduce its thickness. Of course, a source of gas 81 injects gas into the enclosure 78 but outside the manifold 77 to form a gaseous layer 18 in the usual manner by passing through the plate 72.

One could imagine the simultaneous use of several capillary systems, each connected to a different suction device, or even to blowing devices in order to perfect the equalisation of the pressure within the gaseous layer 18; such capillary systems would be arranged in concentric circles of different diameter across the plate. Again, one could place a whole series of capillaries similar to that in FIG. 9 dedicated solely to the measurement of the pressure at various radii of the gaseous layer 18 independently or not of the capillary system for regulating the pressure.

Figure 13:
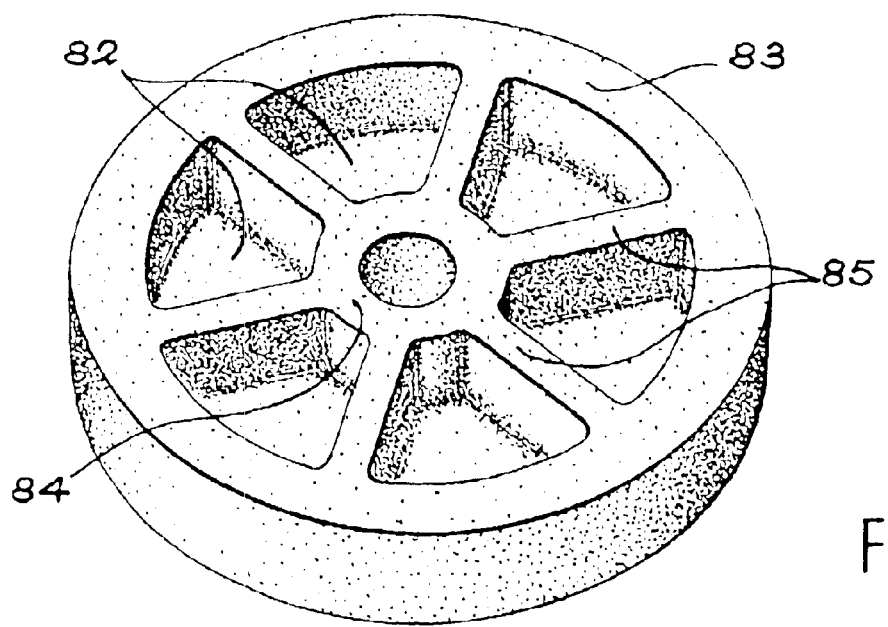

We return to the ribs in order to give them a shape that seems particularly suitable to strengthen a plate 82. FIG. 13 shows that the plate 82 includes, within a flange 83, a polygonal rib 84 extending almost to the centre of the plate 82 and of small radius and straight, radial ribs 85 connecting the flange 83 to the corners of the polygon. In this case the polygon is a hexagon and there are six radial ribs 85. A central circular rib could replace the polygonal rib.

Figure 14:
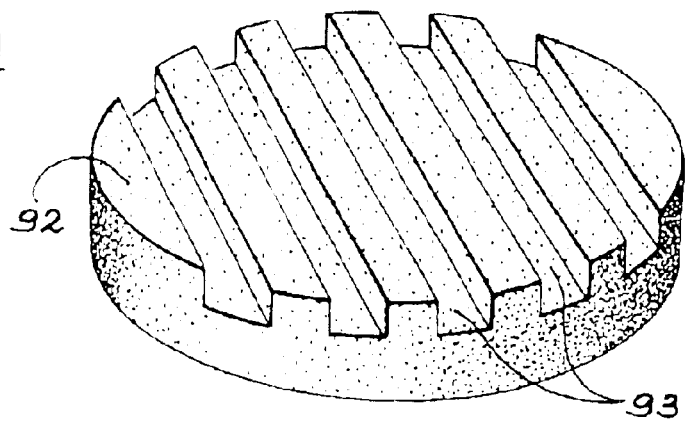
FIG. 14 shows a possible use of capillaries.
Figure 15:
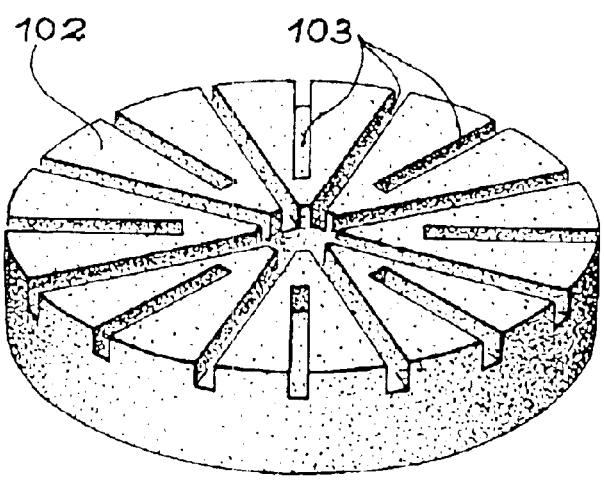
FIGS. 15 and 16 show two possible configurations of grooves.

An arrangement of a different type from the preceding ones could achieve the same purpose of equalising the thickness of the gaseous layer 18: FIG. 14 shows a plate 92 whose upper surface is machined with straight, parallel grooves 93 that encourage the dispersion of gas from the layer 18 towards its edge; the same effect is produced with radial grooves 103 in the plate 102 in FIG. 15.

Figure 16:
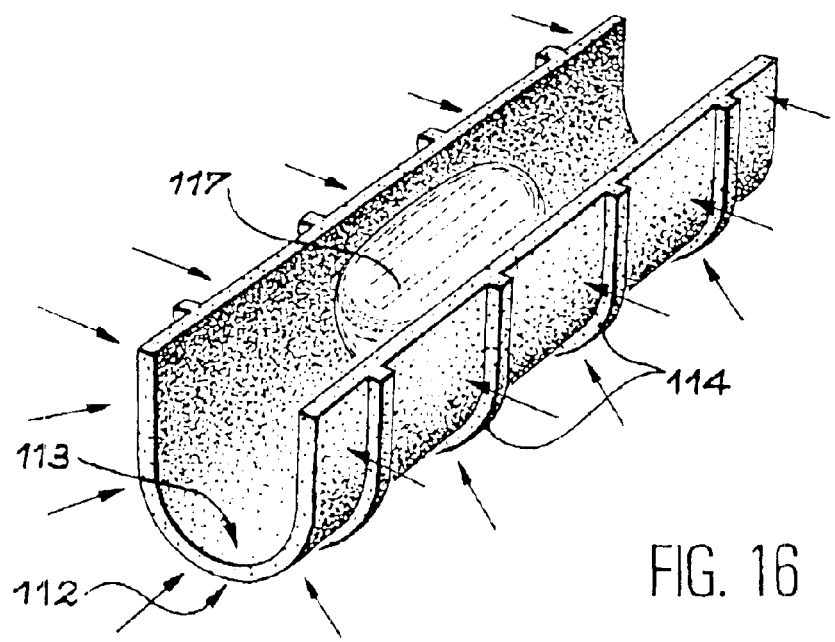

Finally, we must mention that the invention can be extended to other forms than flat, circular plates: thus FIG. 16 shows a trough 112 in the hollow part of which 113 a liquid mass 117 moves under the action of gravity; the excess pressure is produced here on the outer surface of the trough 112, as shown by the arrows. The invention is applied by producing parallel, horseshoe shaped ribs 114 on the outer surface of the trough 112; in this case the ribs are not for the purpose of equalising the thickness of the gaseous layer of the liquid mass 117 but provide some strengthening of the trough 112. Other forms of porous supporting walls, such as cylindrical enclosures or other symmetrical or non-symmetrical shapes can be strengthened in accordance with the invention.

The materials used to produce these porous walls must be carefully chosen in order to avoid any chemical reaction with the material to be supported in the event of point contact. It is best to select them from sintered glass and porous materials (tungsten, graphite, etc.), ceramics (aluminium oxide, zirconium carbide, boron nitride, zirconia, thoria, etc.).

What is claimed is:

1. Porous wall of a device for supporting a liquid by means of a gaseous layer resulting from the flow of a gas through at least one capillary that passes through the wall, wherein said device has a strengthening structure on a side of the wall opposite to the gaseous layer containing ribs, and a pressure measurement device in fluid communication with said at least one capillary.

2. Porous wall in accordance with claim 1, wherein the wall is circular, and at least one of the ribs is circular.

3. Porous wall in accordance with claim 2, wherein the circular rib forms chambers with different pressures in the device.

4. Porous wall in accordance with claim 1, wherein the wall is circular, and the pressure measurement device is in fluid communication with a capillary at the centre of the wall.

5. Porous wall of a device for supporting a liquid by means of a gaseous layer resulting from the flow of a gas through at least one capillary that passes through the wall, wherein said device has a strengthening structure on a side of the wall opposite to the gaseous layer containing ribs, and a pressure regulating device in fluid communication with said at least one capillary.

6. Porous wall in accordance with claim 5, wherein the wall is circular, and at least one of the ribs is circular.

7. Porous wall in accordance with claim 6, wherein the circular rib forms chambers with different pressures in the device.

8. Porous wall in accordance with claim 5, wherein the wall is circular, and the pressure regulating device is in fluid communication with a capillary at the centre of the wall.

* * * * *